United States Patent
Hong (10) Patent No.: US 7,253,808 B2
(45) Date of Patent: Aug. 7, 2007

(54) TOUCH SCREEN SYSTEM AND DISPLAY DEVICE USING THE SAME

(75) Inventor: Hee Jung Hong, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 533 days.

(21) Appl. No.: 10/701,638

(22) Filed: Nov. 6, 2003

(65) Prior Publication Data

US 2004/0095334 A1   May 20, 2004

(30) Foreign Application Priority Data

Nov. 18, 2002 (KR) ............... 10-2002-0071681
Nov. 20, 2002 (KR) ............... 10-2002-0072353

(51) Int. Cl.
  *G09G 5/00* (2006.01)
(52) U.S. Cl. ............... 345/173; 178/18.01
(58) Field of Classification Search ............ 345/173; 178/18.01; 361/679, 686
See application file for complete search history.

(56) References Cited

U.S. PATENT DOCUMENTS

| 5,800,175 A * | 9/1998 | Zuk et al. ............ 433/217.1 |
| 6,965,375 B1 * | 11/2005 | Gettemy et al. ............ 345/173 |
| 2003/0067580 A1 * | 4/2003 | Song et al. ............ 349/187 |

FOREIGN PATENT DOCUMENTS

| CN | 1361471 | 7/2002 |
| JP | 07-239730 | 9/1995 |
| JP | 09-026852 | 1/1997 |
| KR | 2002-56411 | 12/2000 |

* cited by examiner

*Primary Examiner*—Kent Chang
(74) *Attorney, Agent, or Firm*—McKenna Long & Aldridge LLP

(57) ABSTRACT

A touch screen system includes a touch panel to input image signals, a touch controller to drive the touch panel, an extension between the touch panel and the touch controller, and an anisotropic conductive film electrically interconnecting the extension to the touch controller.

4 Claims, 8 Drawing Sheets

TOUCH SCREEN SYSTEM AND DISPLAY DEVICE USING THE SAME

The present invention claims the benefit of Korean Patent Application Nos. P2002-71681 and P2002-72353 filed in Korea on Nov. 18, 2002 and Nov. 20, 2002, respectively, which are hereby incorporated by reference.

BACKGROUND OF THE INVENTION

1. Field of the Invention

The present invention relates to a touch panel system, and more particularly, to a touch panel system for a liquid crystal display (LCD) device.

2. Discussion of the Related Art

Presently, liquid crystal display (LCD) devices are commonly used because of their ability to produce high quality images, as well as their thin profile, light weight, and low power consumption. Liquid crystal module (LCM) devices are used for displaying video signals input from external sources, such as LCD panels, and commonly include polarizing plates, power sources, such as backlight devices, and light-guiding plates. The LCD panels include upper and lower glass substrates, and liquid crystal material injected between the upper and lower glass substrates. In addition, the polarizing plates are formed on lower and upper surfaces of the LCD panel for polarizing light irradiated onto the LCD panel using the backlight device. Moreover, a printed circuit board (PCB) is provided below a main support at a rear of the LCM device, and a drive integrated circuit (D-IC) is provided on the PCB to drive switching devices (i.e., thin film transistors) of the LCM device. Accordingly, the LCM device is electrically connected to the PCB using a tape carrier package (TCP) so that the video signals of the D-IC are transmitted to the LCM device. Furthermore, a digitizer is provided in the LCD device to display images on a screen and to input electric graphic image signals thereon. The digitizer is commonly referred to as an electric graphic input panel (EGIP) or a touch panel. Due to rapid development of LCD technology, it is possible to perform graphic image work that requires high resolution on the LCD device, whereby the digitizer is used as an input device of a notebook computer.

Figure 1:
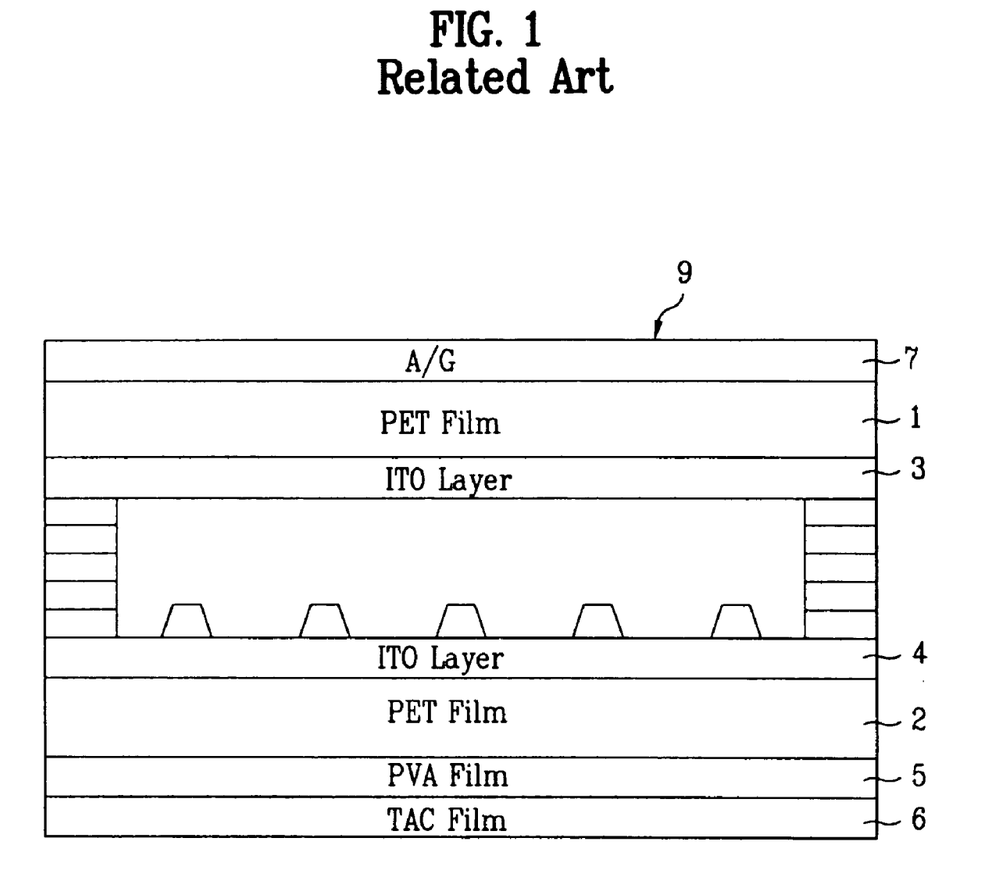
FIG. 1 is a schematic cross sectional view of a touch panel according to the related art.

FIG. 1 is a schematic cross sectional view of a touch panel according to the related art. In FIG. 1, transparent ITO electrodes 3 and 4 are formed on opposing surfaces of two polyethylene terephtalate (PET) films 1 and 2 at a predetermined interval, wherein the two PET films 1 and 2 are bonded to each other using an insulating adhesive. Subsequently, a polyvinyl alcohol (PVA) film 5 is formed below the lower PET film 2 for polarizing light, and a triacetyl cellulose (TAC) film is formed below the PVA film 5 for protecting the PVA film 5 from humidity. In addition, a silver (A/G) layer is formed on the upper PET film 1.

An operation of the touch panel, which is categorized as a 4-line resistive-type touch panel, includes supplying a voltage to one transparent electrode along an X-axis direction, and supplying a voltage to another transparent electrode along a Y-axis direction. For example, a voltage is supplied to an upper transparent electrode 3 along the X-axis direction, and a voltage is supplied to a lower transparent electrode 4 along the Y-axis direction. Accordingly, signals are respectively supplied to the X-axis and the Y-axis in order to detect a location of a touching point in order to read the signals twice. For example, when the voltage is supplied to the upper transparent electrode 3 along the X-axis direction, the upper and lower transparent electrodes 3 and 4 contact each other at a predetermined portion, and a voltage value of the X-axis location is read through the lower transparent electrode 4. Similarly, when the voltage is supplied to the lower transparent electrode 4 along the Y-axis direction, the upper and lower transparent electrodes 3 and 4 contact each other at a predetermined portion, and a voltage value of the Y-axis location is read through the upper transparent electrode 3. Accordingly, the upper and lower transparent electrodes 3 and 4 have predetermined resistance values, so that the voltage value varies in accordance with a contact location of the upper and lower transparent electrodes 3 and 4. Thus, X-axis and Y-axis voltage values are input to a controller, whereby the controller detects coordinates of the touching point according to the X-axis and the Y-axis values.

When a predetermined portion of the upper substrate is touched with a finger or a pen, the upper and lower transparent electrodes 3 and 4 contact each other at the predetermined portion. Accordingly, the voltage values, which vary by the resistance value of the touching point, is output. For example, in order to read the voltage values that vary by the resistance value of the touching point, electrodes and lines for supplying the voltage to the upper and lower transparent electrodes 3 and 4 is necessary in order to read the voltage values.

Figure 2:
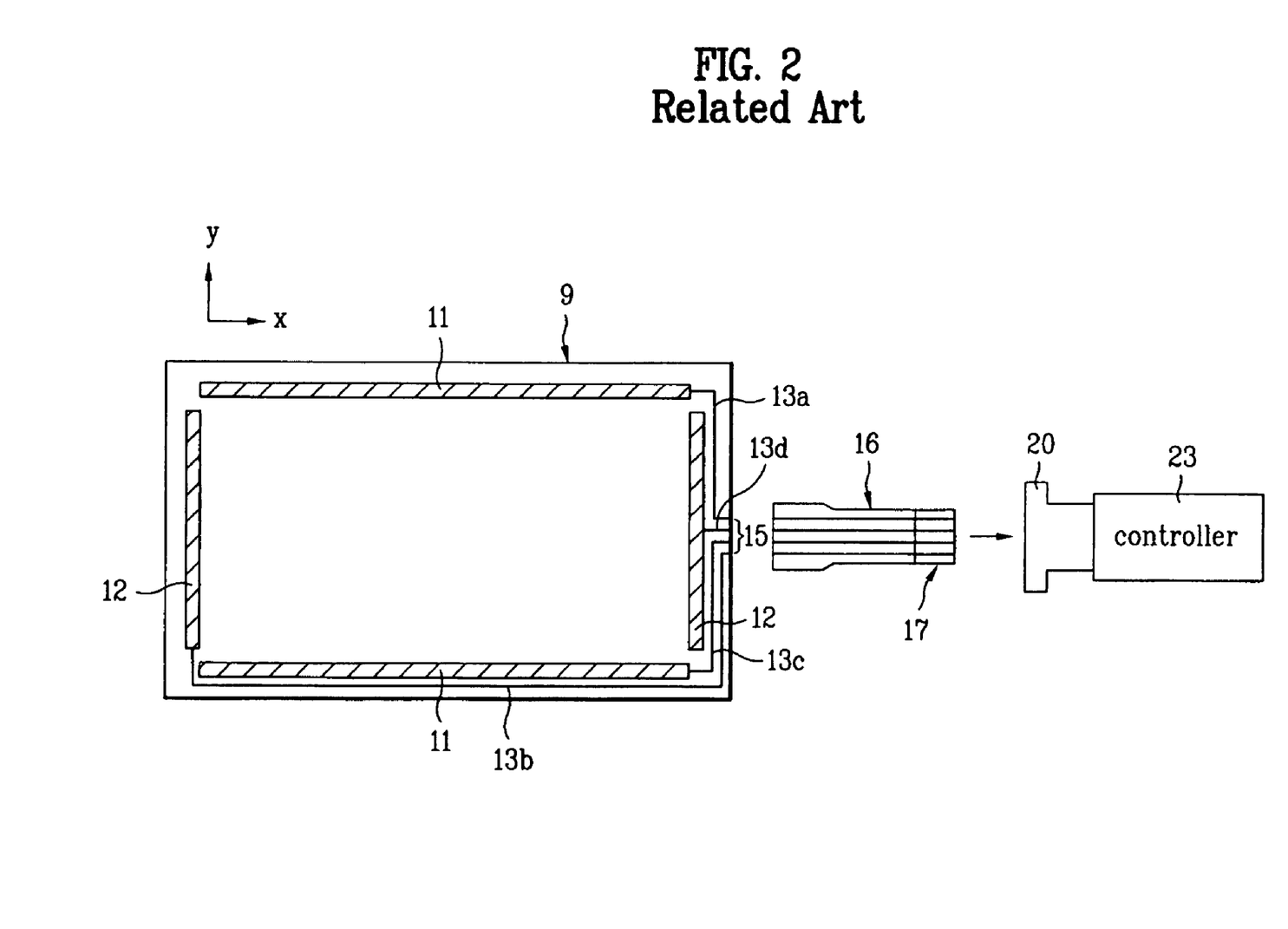
FIG. 2 is a plan view of a connection structure between an extension of a touch panel and a controller according to the related art.

FIG. 2 is a plan view of a connection structure between an extension of a touch panel and a controller according to the related art. In FIG. 2, a touch panel 9 includes two silver (A/G) electrodes 12 formed along left and right sides of an upper PET film 1 along the X-axis direction, and two A/G electrodes 11 formed along upper and lower sides of a lower PET film 2 along the Y-axis direction. Accordingly, the A/G electrodes 11 and 12 are formed within a dead space region of 2 μm to 3 μm along one direction of the touch panel 9. Moreover, a size of the touch panel 9 corresponds to sizes of an upper substrate of the LCD panel, wherein electrode lines of the touch panel 9 are formed in a 4-line resistive-type configuration.

In order to operate the 4-line resistive-type touch panel, interconnect of the touch panel 9, a touch controller 23, and a computer (i.e., CPU) using signal lines is required. A device in which the touch panel 9 and the touch controller 23 are connected to each other is referred to as a touch screen assembly. The touch controller 23 switches voltages and output signals provided to the upper and lower substrates of the touch panel 9, and receives input location information as electric signals. Then, the touch controller 23 converts the electric signal from analog signals to digital data, and transmits the digital data to the computer. Accordingly, the touch controller 23 is positioned separately from the LCD device, which is integrated with the touch panel, i.e, the touch controller 23 is positioned outside of the LCD device.

With the creation of ever smaller LCD devices having thin profiles and light weight to improve portability, integration of the LCD device with the touch controller is desired. For example, the touch controller can be mounted inside the LCD device, and the touch controller may be provided as a chip-type device positioned at rear of the LCM device.

In FIG. 2, the A/G electrodes 11 and 12 and conductive lines 13a, 13b, 13c, and 13d transmit and read the electric signals, and are formed within the dead space region of the touch panel 9. In addition, an extension of one of four sides of the touch panel 9 provides a connection part 15 that include end portions of the conductive lines 13a, 13b, 13c, and 13d. A flexible printed circuit board (FPCB) 16 is connected to the end portions of the conductive lines 13a, 13b, 13c, and 13d at the connection part 15. The FPCB 16 is used for electrically connecting the conductive lines 13a, 13b, 13c, and 13d of the A/G electrodes 11 and 12 of the touch panel 9 to the touch controller 23.

When the FPCB 16 of the touch panel 9 is connected to the touch controller 23, an FPCB connector 20 is mounted within the controller 23 so that a connection part 17 of the FPCB 16 is inserted into the FPCB connector 20, thereby electrically interconnecting the A/G electrodes 11 and 12 of the touch panel 9 to the touch controller 23. Since the FPCB 16 is formed of soft material(s), a stiffener is provided with the connection part 17 of the FPCB 16 for easy insertion of the connection part 17 of the FPCB 16 to the FPCB connector 20. Accordingly, the signals output from the 4-line electrodes (A/G electrodes 11 and 12) of the touch panel 9 are transmitted to the touch controller 23 using the FPCB 16 that is inserted into the FPCB connector 20 of the touch controller 23, thereby electrically interconnecting the touch panel 9 to the touch controller 23.

However, the signal connection structure between the touch panel and the touch controller according to the present invention has the following disadvantages. First, since the FPCB 16 of the touch panel 9 is electrically connected to the touch controller 23 by the FPCB connector 20, the FPCB connector 20 is thicker than IC chips below the LCM, whereby a total thickness of the entire interconnection system becomes thick. Thus, obtaining a thin profile and light weight of the LCD device is not achieved. Second, in order to connect the FPCB 16 of the touch panel 9 to the touch controller 23, the FPCB connector 20 is required, thereby increasing manufacturing costs. Third, when connecting the signal lines of the FPCB 16 to the FPCB connector 20, a connection failure may be generated.

SUMMARY OF THE INVENTION

Accordingly, the present invention is directed to a touch screen system and display device using a touch screen system that substantially obviates one or more of the problems due to limitations and disadvantages of the related art.

An object of the present invention is to provide a touch screen system having a signal connection structure between a touch panel and a touch controller for obtaining a thin profile and light weight device.

Another object of the present invention is to provide a display device having a touch screen system having a signal connection structure between a touch panel and a touch controller for obtaining a thin profile and light weight device.

Additional features and advantages of the invention will be set forth in part in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described, a touch screen system includes a touch panel to input image signals, a touch controller to drive the touch panel, an extension between the touch panel and the touch controller, and an anisotropic conductive film electrically interconnecting the extension to the touch controller.

In another aspect, a touch screen system includes a touch panel to input image signals, a touch controller to drive the touch panel, and an extension having a plurality of signal lines to transmit electrical signals between the touch panel and the touch controller, wherein the extension includes a plurality of end portions that correspond to a total number of the signal lines connected to the touch controller.

In another aspect, a touch screen system includes a touch panel having a plurality of electrodes, a touch controller having a plurality of contact pads, and an extension having a first portion physically connected to an end region of the touch panel, a second portion electrically connected to the touch controller, and a third portion disposed between the first and second portions, wherein the second portion of the extension includes a plurality of individual end portions electrically connected to the plurality of contact pads.

In another aspect, a liquid crystal display device includes a liquid crystal module, a touch controller provided in a touch controller area at a first edge of the liquid crystal module, a plurality of data driver integrated circuits provide along a second edge of the liquid crystal module within a data driver area, a plurality of gate driver integrated circuits provided along a third edge of the liquid crystal module within a gate driver area, and an extension provided along the data driver area into the touch controller area.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

A touch screen assembly according to the present invention will be described with reference to the accompanying drawings.

Figure 3:
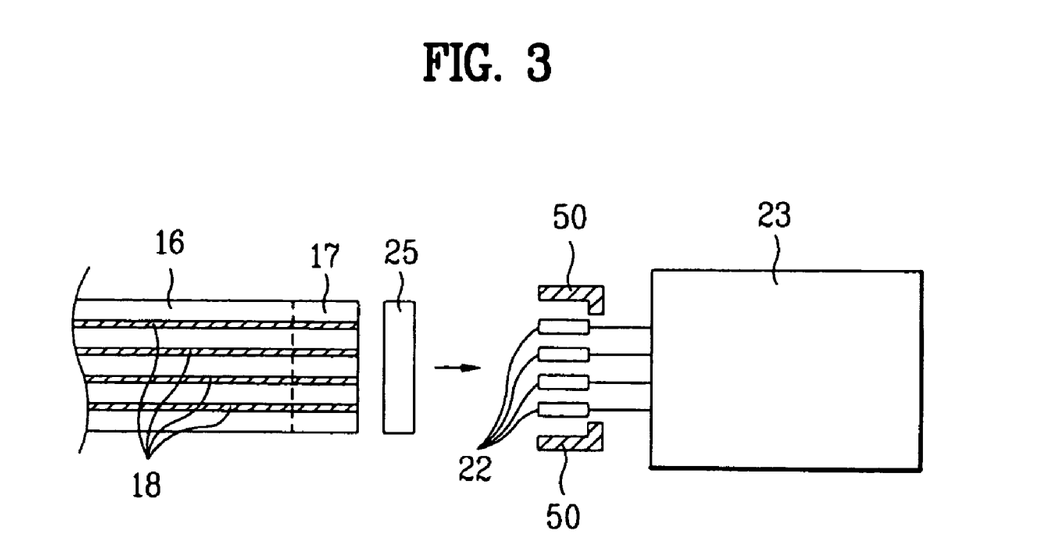
FIG. 3 is a plan view of an exemplary signal connection structure between an extension and controller connection part according to the present invention.

FIG. 3 is a plan view of an exemplary signal connection structure between an extension and controller connection part according to the present invention. In FIG. 3, a plurality of connection pads 22 of a touch controller 23 may be formed on a PCB substrate having the touch controller 23 contained therein, and an anisotropic conductive film (ACF) 25 may be formed on an upper surface of the connection pads 22. In addition, an extension 16 may be provided to be connected to a touch panel, which may be similar to the touch panel 9 (of FIG. 2), and may be formed on the ACF 25. Accordingly, a plurality of signal lines 18 formed on the extension 16 may be connected to the connection pads 22. Thus, the signal lines 18 of a connection part 17 of the extension 16 may be aligned to correspond to the connection pads 22. The ACF 25 may include plastic material(s) coated with metal material(s). Alternatively, the ACF 25 may include a film upon which conductive particles, such as metal particles, are scattered, thereby simultaneously providing electric signal connection and adhesion.

Figure 4:
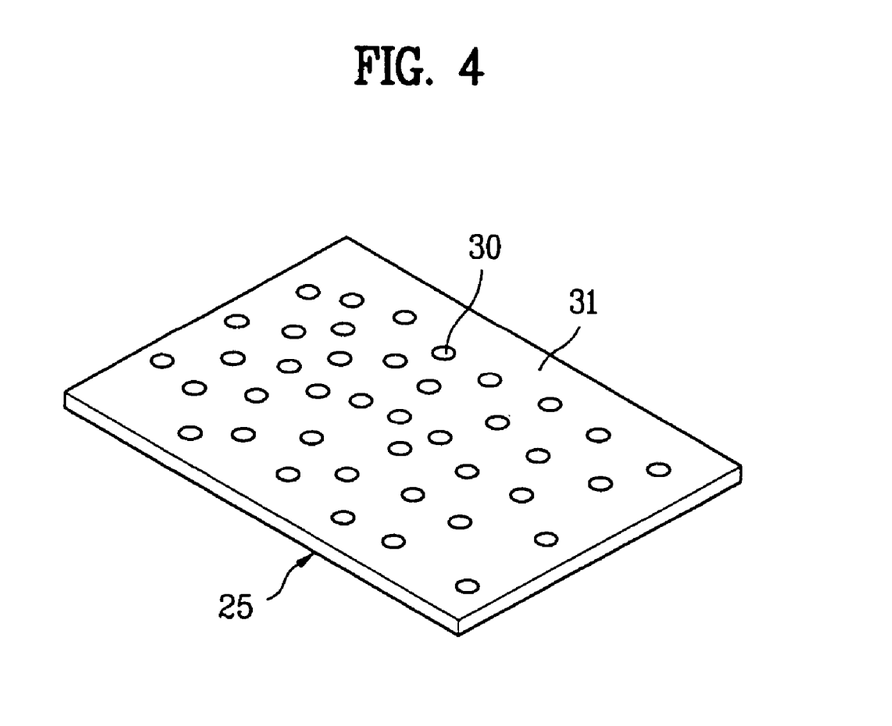
FIG. 4 is a perspective view of an exemplary anisotropic conductive adhesive according to the present invention.

FIG. 4 is a perspective view of an exemplary anisotropic conductive adhesive according to the present invention. In FIG. 4, conductive particles 30, such as metal particles, may be scattered in an adhesive film 31 formed of thermoplastic or thermosetting resin(s), thereby forming the ACF 25. Then, although not shown, a first conductive terminal may be formed on a front surface of the ACF 25 and a second conductive terminal may be formed on a rear surface of the ACF 25. Accordingly, pressure may be applied to the ACF 25 so that the first conductive terminal is electrically connected to the second conductive terminal by the conductive particles 30. Next, as shown in FIG. 3, the ACF 25 may be positioned between the extension 16 of the touch panel 9 (in FIG. 2) and the connection pads 22 of the touch controller 23 to electrically interconnect the extension 16 and the connection pads 22. Thus, current may flow between the extension 16 and the connection pads 22.

Figure 5:
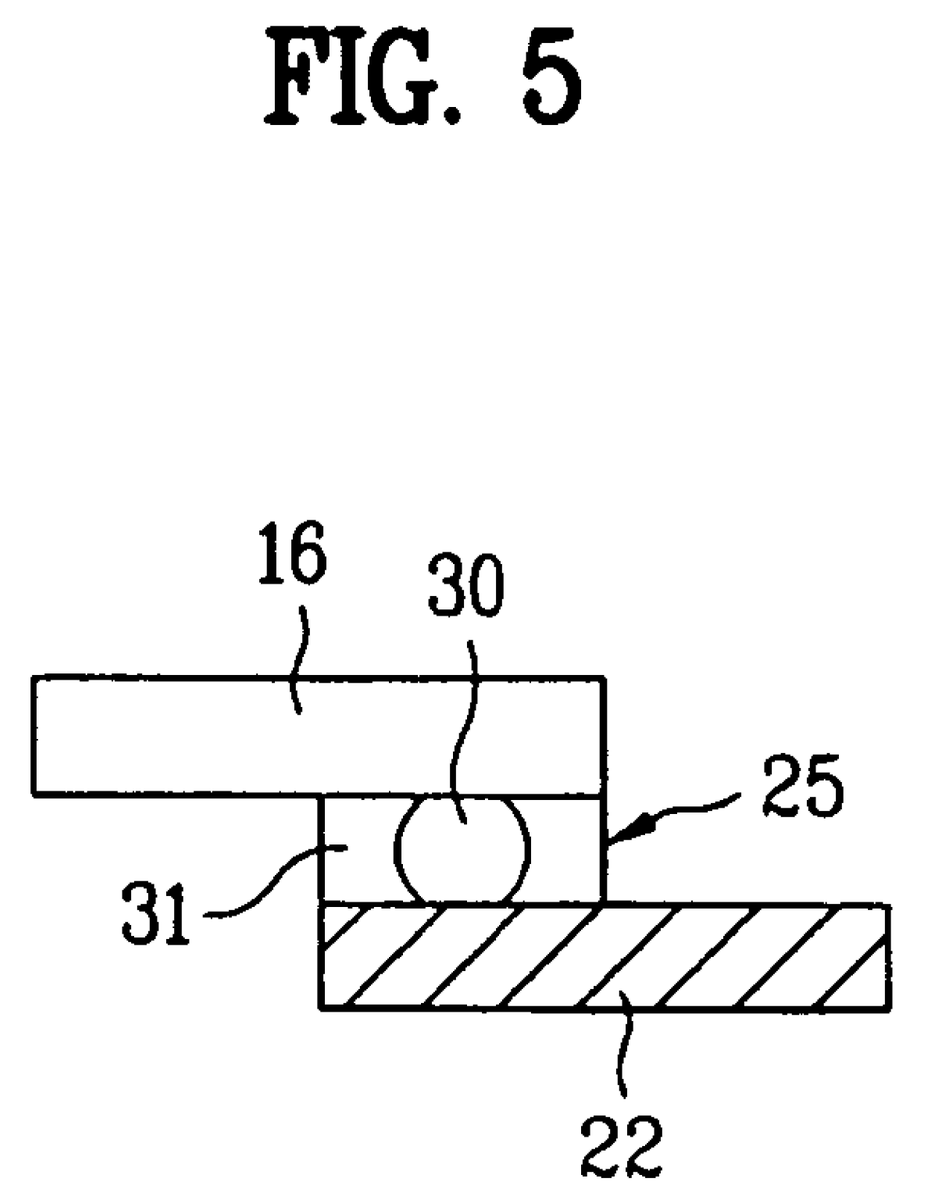
FIG. 5 is a cross sectional view of an exemplary extension and controller connection part according to the present invention.

FIG. 5 is a cross sectional view of an exemplary extension and controller connection part according to the present invention. In FIG. 5, the extension 16 may be formed to bond to the connection pads 22 of the touch controller 23. Since the ACF 25 may be inserted between the extension 16 of the touch panel 9 (in FIG. 2) and the connection pads 22 of the touch controller 23 (in FIG. 3), then the signal lines 18 of the extension 16 (in FIG. 3) may be aligned to correspond to the connection pads 22. Next, pressure and heat may be applied to the extension 16 and controller connection pads 22, so that an adhesive 31 of the ACF 25 melts. Accordingly, the scattered conductive particles 30 of the ACF 25 may be pressed between each signal line 18 of the extension 16 and each connection pad 22. Thus, the conductive particles 30 may be in electrical and physical contact with the signal lines 18 and the connection pads 22, thereby ensuring sufficient electrical conduction. In addition, the adhesive 31 may be electrically charged between adjacent ones of the signal lines 18, except at portions where the conductive particles 30 are present. Accordingly, the conductive particles 30 may be separately positioned, thereby obtaining high electrical insulating characteristics. Accordingly, adhesive reliability of the ACF 25 may be significantly affected by the performance of the conductive particles 30 and the adhesive 31.

Since the ACF 25 may provide electrical interconnect between the plurality of signal lines 18 and the connection pads 22, accurate positioning of the plurality of signal lines 18 with respect to the connection pads 22 may be necessary. For example, if the plurality of signal lines 18 are not accurately positioned with respect to the connection pads 22, interconnection between the touch panel 9 (in FIG. 2) and the touch controller 23 (in FIG. 3) may not be properly made. Accordingly, the touch controller 23 (in FIG. 3) may be mounted on a PCB that may include the connection pads 22.

In FIG. 3, the connection pads 22 may be formed in the touch controller 23 to correspond to the signal lines 18 of the extension 16. Accordingly, when the touch controller 23 is provided at a rear portion of an LCM, the touch controller 23 and the connection pads 22 may be mounted on a source or gate PCB at the rear of the LCM. In addition, a fixing guide 50 may be provided for fixing the location of the extension 16 to provide correct signal connection between each connection pad 22 and each signal line 18 of the extension 16. The fixing guide 50 may be formed in a shape of "U" so that the connection part 17 of the extension 16 may be fixed by the fixing guide 50. However, the fixing guide 50 may not be limited to a U-shape, and may have variable lengths and thicknesses. For example, the fixing guide 50 may be formed to have a first thickness corresponding to a total thickness of the ACF 25 and a second thickness corresponding to a thickness of the extension 16.

In FIG. 3, the connection part 17 of the extension 16 that opposes the touch controller 23 may be formed to electrically contact the signal lines 18 using the ACF 25. Accordingly, the connection part 17 of the extension 16 may have signal lines 18 that extend from an upper surface to a lower surface for surrounding the connection part 17 of the extension 16. Alternatively, the signal lines 18 may be formed only along the surface that opposes a connection part of the touch controller 23. Alternatively, the ACF 25 may be electrically connected between the signal lines 18 of the extension 16 to the connection pads 22 of the touch controller 23 using a permanent connection, such as solder.

Figure 6A:
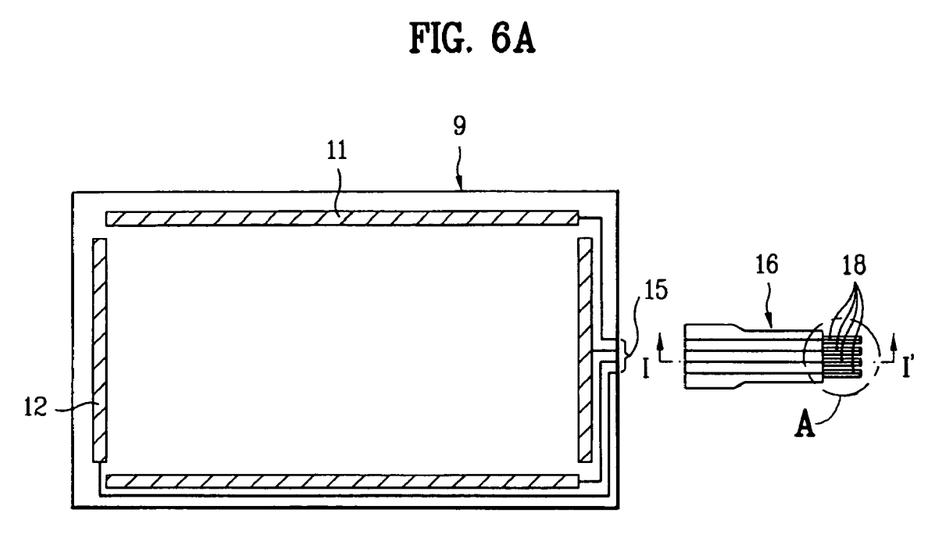
FIG. 6A is a plan view of another exemplary connection structure between an extension of a touch panel and a controller according to the present invention.
Figure 6B:
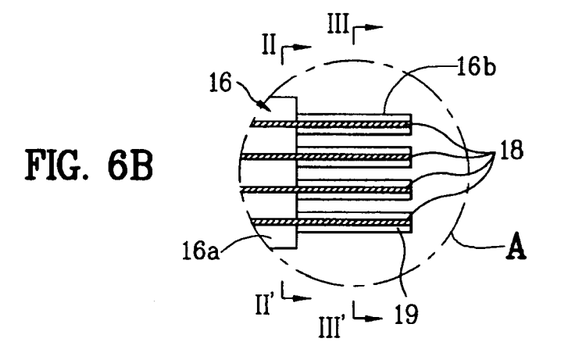
FIG. 6B is an enlarged view of "A" of FIG. 6A according to the present invention.
Figure 6C:
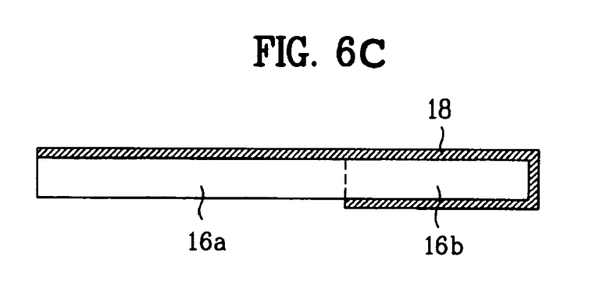
FIG. 6C is a cross sectional view along I-I' of FIG. 6A according to the present invention.

FIG. 6A is a plan view of an exemplary connection structure between an extension of a touch panel and a controller according to the present invention, FIG. 6B is an enlarged view of "A" of FIG. 6A according to the present invention, and FIG. 6C is a cross sectional view along I-I' of FIG. 6A according to the present invention. In FIGS. 6A, 6B, and 6C, the extension 16 may include end portions 16b that may be divided into a plurality of finger portions 19 that may correspond to a plurality of signal lines 18, and a main portion 16a. Although four end portions 16b are shown, any number of end portions 16b may be provided that correspond to the type of resistive-type touch panel to be used. Accordingly, the main portion 16a may include the signal lines 18 connected to electrodes 11 and 12 of the touch panel 9 along an upper or lower surface thereof. The main portion 16a may include insulating and flexible material(s) to provide easy connection of the signal lines 18. For example, the extension may include epoxy or bakelite resin(s) and the end portions 16b may be made to be relatively thin, thereby improving flexibility of the end portions 16b. In addition, an end portion of the main portion 16a may be formed having a relatively larger width as compared to a total width of the end portions 16b, thereby providing a stable connection to a connection part 15 of the touch panel 9. Moreover, the end portions 16b may be spaced apart from each other, thereby accommodating for soldering at the touch controller 23 (in FIG. 2).

Figure 7A:
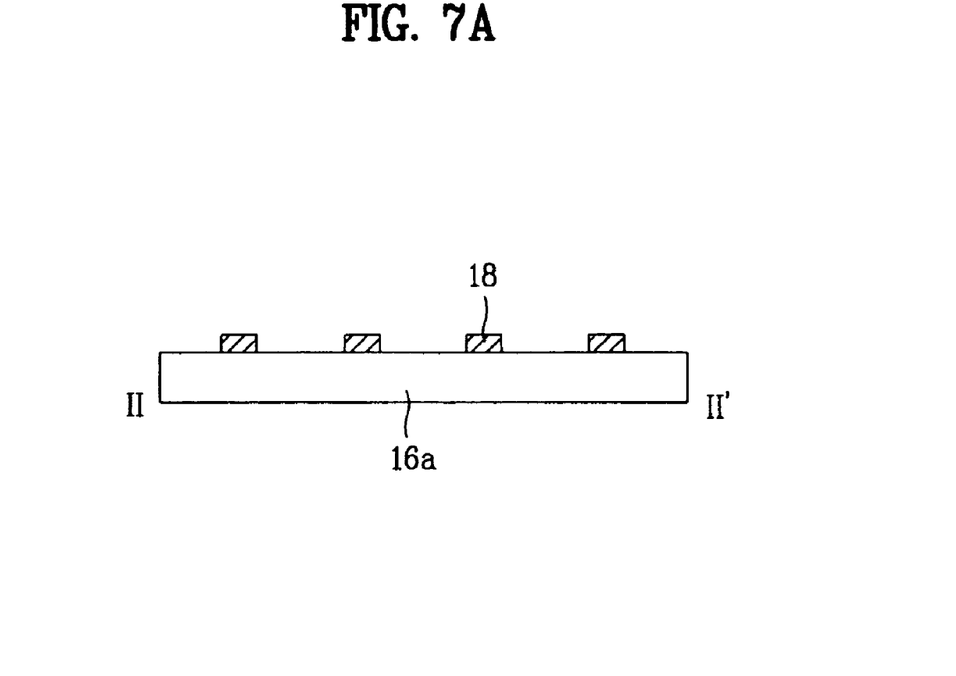
FIG. 7A is a cross sectional view along II-II' of FIG. 6B according to the present invention.
Figure 7B:
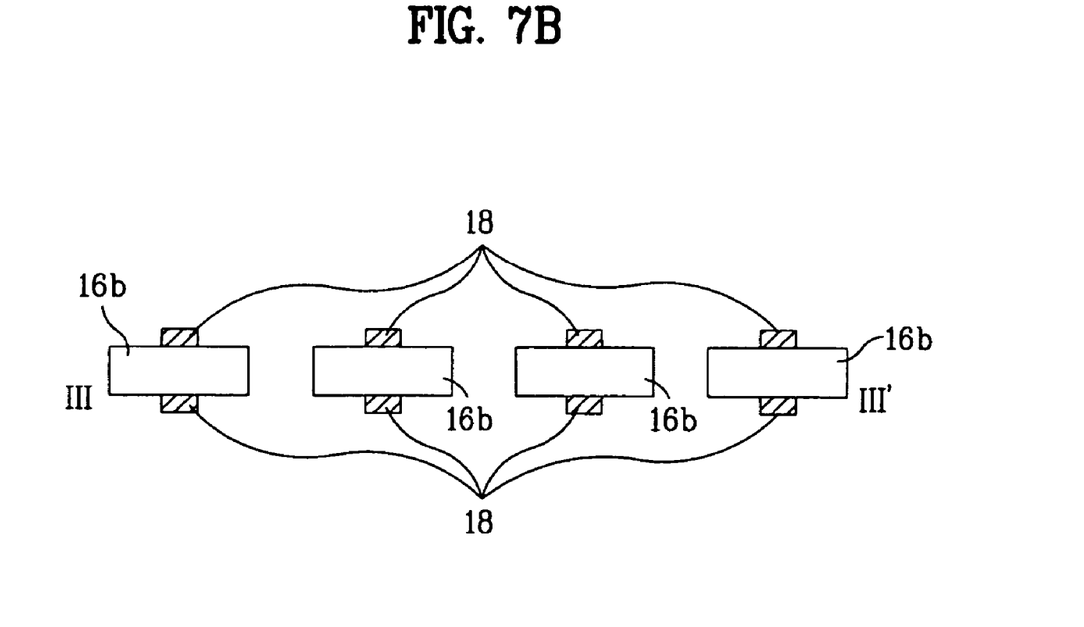
FIG. 7B is a cross sectional view along III-III' of FIG. 6B according to the present invention.

FIG. 7A is a cross sectional view along II-II' of FIG. 6B according to the present invention, and FIG. 7B is a cross sectional view along III-III' of FIG. 6B according to the present invention. In FIG. 7A, the signal lines 18 may extend along an upper surface of the main portion 16a. In FIG. 7B, the signal lines 18 may extend along upper and lower surfaces of the end portion 16b. Accordingly, contact areas of the signal lines 18 may increase, thereby preventing electric disconnection between the touch panel 9 (in FIG. 6A) and the touch controller 23 (in FIG. 2).

Figure 8A:
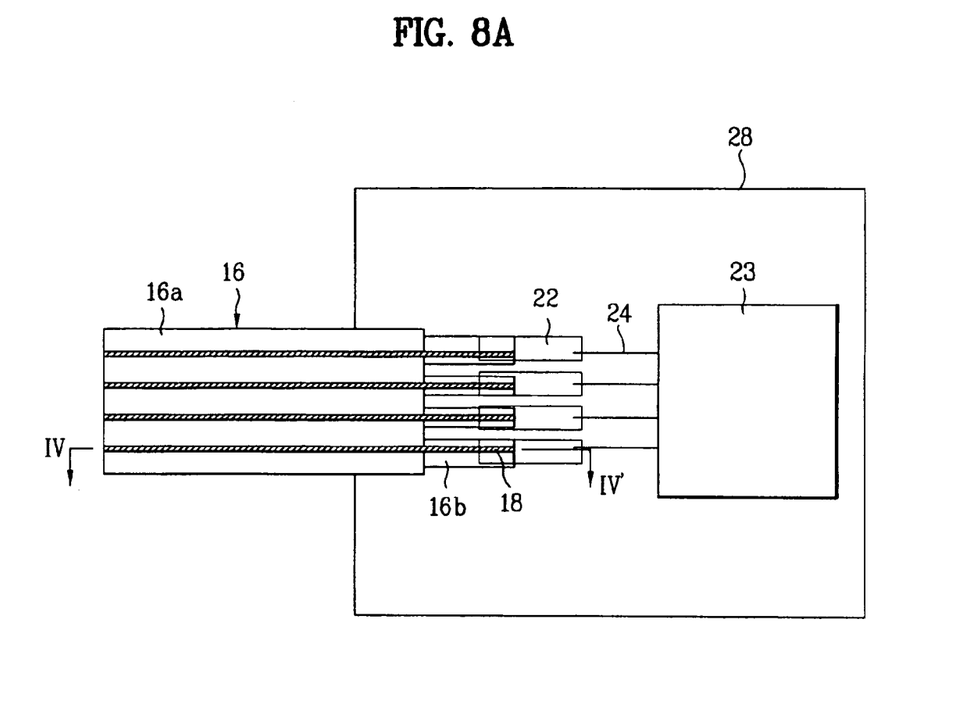
FIG. 8A is a plan view of an exemplary connection structure between an extension and controller according to the present invention.

FIG. 8A is a plan view of an exemplary connection structure between an extension and controller according to the present invention. In FIG. 8A, connection pads 22 may be provided for a touch controller 23 for signal transmission on a printer circuit board 28, wherein the connection pads 22 may be positioned to correspond to the signal lines 18 of the extension 16. Accordingly, the connection pad 22 may be formed having rectangular plate shapes of conductive material(s). Alternatively, the connection pads may have different geometries to accommodate corresponding numbers of the signal lines 18. For example, the connection pads 22 may be formed having opposing triangular shapes, circular shapes, and polygonal shapes. In addition, the connection pads 22 may have a hole to which the end portions 16b may be inserted.

In FIG. 8A, the connection pads 22 may be electrically connected to the touch controller 23 using wires 24. Alternatively, conductive lines may be provided to electrically interconnect the connection pads 22 and the touch controller 23. In addition, the connection pads 22 may be formed to correspond to the signal lines 18, wherein the signal lines 18 may be aligned along a lateral center line of the connection pads 22. However, signal lines 18 corresponding to outer ones of the connection pads 22 may be offset from the lateral center line of the connection pads 22. Alternatively, the connection pads 22 may not be provided such that the end portions 16b may be electrically connected to a signal connection terminal (not shown) of the touch controller 23 using solder.

Figure 8B:
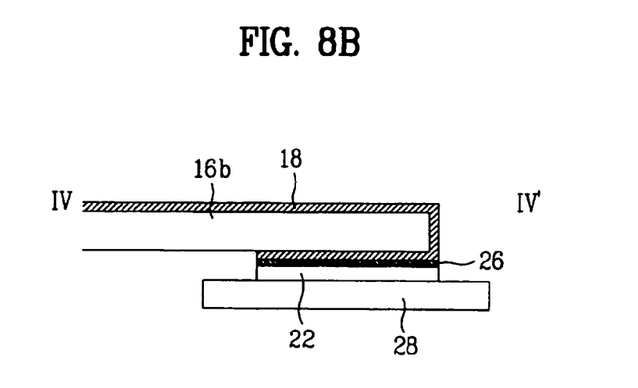
FIG. 8B is a cross sectional view along IV-IV' of FIG. 8A according to the present invention.

FIG. 8B is a cross sectional view along IV-IV' of FIG. 8A according to the present invention. In FIG. 8B, each signal line 18 may have a first signal line portion that extends along the upper surface of the end portion 16b, and a second signal line portion that extends along the lower surface of the end portion 16b. Accordingly, the second signal line portion of the signal line 18 may be electrically connected to each connection pad 22 of the touch controller 23 using solder 26 on the printed circuit board 28. Accordingly, the electric signal connection between each connection pad 22 of the touch controller 23 and each signal line 18 of the extension 16 of the touch panel 9 may be stabilized thereby obtaining a device having a thin profile and light weight.

Figure 9:
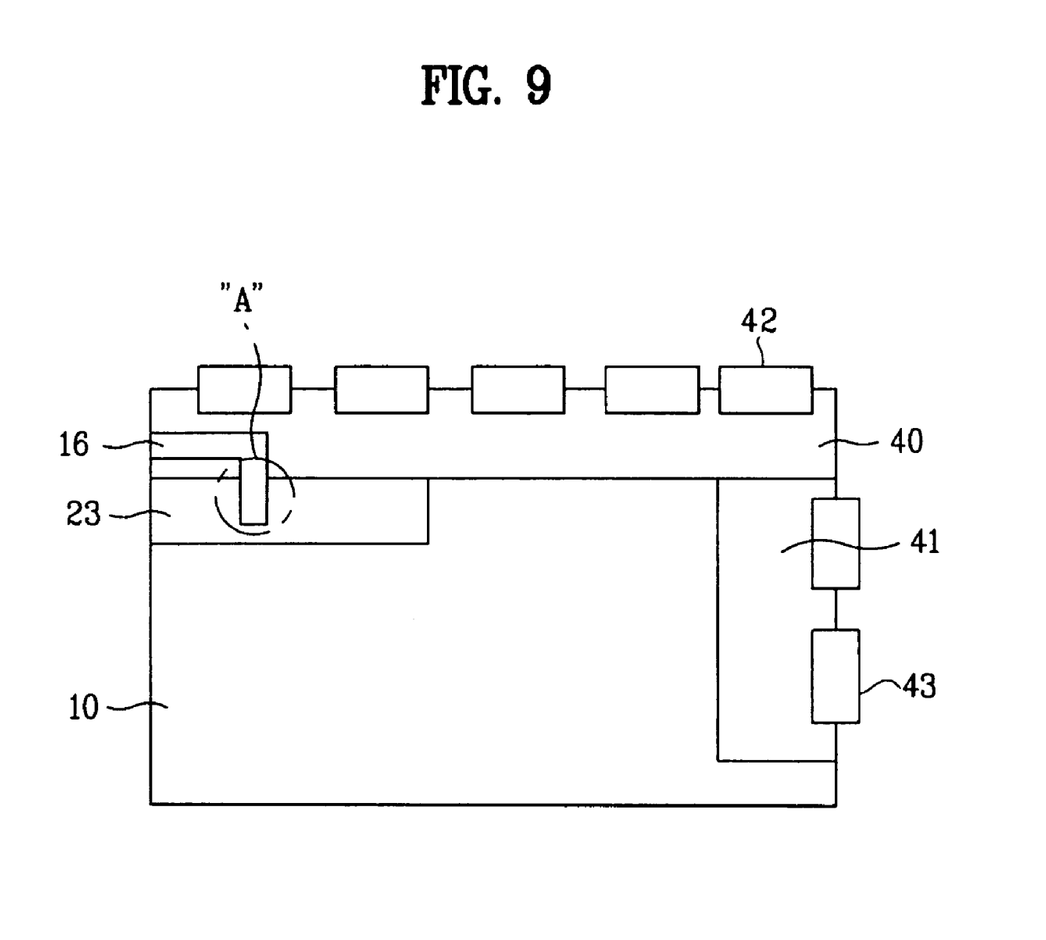
FIG. 9 is a plan view of an exemplary touch controller according to the present invention.

FIG. 9 is a plan view of an exemplary touch controller according to the present invention. The touch controller of FIG. 9 may incorporate one of the exemplary connection structures of FIGS. 3 and 6A-6C. In FIG. 9, a touch panel (not shown) may be mounted at a front of an LCM 10, and signal connections between an extension 16 and a touch controller 23 may be provided at region "A" at a rear of the LCM 10. Accordingly, the extension 16 from the touch panel may be connected to a connection part of the touch controller 23 integrated with the rear of the LCM 10 using an ACF 25 (in FIGS. 3 and 5) or by soldering. In addition, the interconnection of the extension 16 and the touch controller 23 may be performed using a method similar to a process for bonding data driver ICs 42 onto a data driver area 40 and gate driver ICs 43 onto a gate driver area 41. Thus, the adhesion process may be performed using a manually- or automatically-operated system.

It will be apparent to those skilled in the art that various modifications and variations can be made in touch panel system of the present invention. Thus, it is intended that the present invention covers the modifications and variations of this invention provided they come within the scope of the appended claims and their equivalents.

What is claimed is:

1. A touch screen system, comprising:
 a touch panel to input image signals;
 a touch controller to drive the touch panel;
 a printed circuit board mounted on the touch controller and including a plurality of connection pads connected with the touch controller;
 a flexible printed circuit connected with the touch panel and including a plurality of signal lines overlapping the plurality of connection pads of the printed circuit board; and
 an anisotropic conductive film electrically interconnecting the signal lines of the flexible printed circuit and connection pads of the printed circuit board.

2. The system according to claim 1, wherein the printed circuit board includes a fixing guide disposed around the connection pads and contacting side portions of the anisotropic conductive film.

3. The system according to claim 1, further comprising a liquid crystal module integrated with the touch panel system, wherein the connection pads of the touch controller are mounted on the printed circuit board.

4. The system according to claim 3, wherein the printed circuit board is disposed at a rear surface of the liquid crystal module.

\* \* \* \* \*